(12) United States Patent
Suzuki

(10) Patent No.: US 7,564,935 B2
(45) Date of Patent: Jul. 21, 2009

(54) AGC CIRCUIT WHICH IS HARD TO BE INFLUENCED BY LEVEL OF INPUT SIGNAL

(75) Inventor: Takeo Suzuki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 582 days.

(21) Appl. No.: 11/479,310

(22) Filed: Jun. 30, 2006

(65) Prior Publication Data
US 2007/0047679 A1   Mar. 1, 2007

(30) Foreign Application Priority Data
Aug. 30, 2005 (JP) ............... 2005-249537

(51) Int. Cl.
*H04L 27/08* (2006.01)
*H03C 3/06* (2006.01)
*H04B 1/18* (2006.01)
(52) U.S. Cl. ............... 375/354; 332/126; 455/182.2
(58) Field of Classification Search ............... 375/345; 331/36 C, 36 L; 332/126; 348/375; 455/182.2, 455/192.2, 333, 126, 127, 2
See application file for complete search history.

(56) References Cited

U.S. PATENT DOCUMENTS 6,211,737 B1 * 4/2001 Fong ............... 330/282

7,312,660 B2 * 12/2007 Koh et al. ............... 330/260

FOREIGN PATENT DOCUMENTS

| JP | 11-55059 | 2/1999 |
|---|---|---|
| JP | 2001-244766 | 9/2001 |

* cited by examiner

*Primary Examiner*—Khai Tran
(74) *Attorney, Agent, or Firm*—Beyer Law Group LLP

(57) ABSTRACT

Provided is an AGC circuit which is hard to be influenced by the level of an input signal.

The AGC circuit includes an amplification element 11 which has an input terminal 11g for receiving an input signal Vin, a ground terminal 11s connected to ground through at least a first resistor RA, and an output terminal 11d which is connected to a power supply source Vcc through at least a second resistor RB and amplifies and outputs the input signal Vin; an AGC voltage generating part 15 which is provided at the subsequent stage of the amplification element 11 and outputs an AGC voltage according to the strength of the input signal as an analog signal; a signal converting part 14 which digital-converts the AGC voltage into a AGC control signal A0 to B2 having a predetermined number of bits; a current negative feedback circuit 12 which changes the impedance ZA of the ground terminal including the first resistor RA to adjust an gain; and a voltage dividing circuit 13 which changes the impedance ZB of the output terminal including the second resistor RB to adjust the gain.

7 Claims, 1 Drawing Sheet

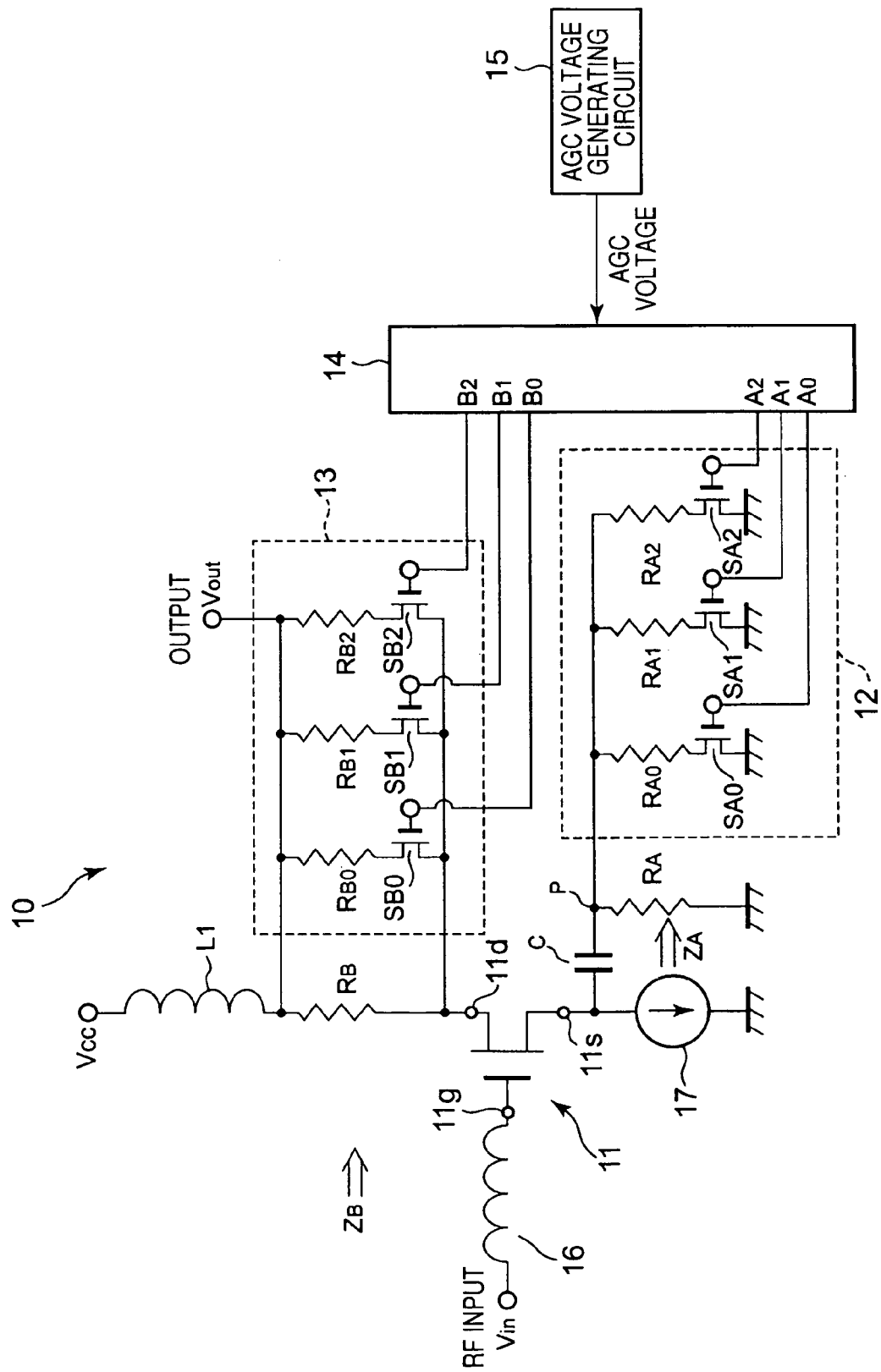
FIGURE

AGC CIRCUIT WHICH IS HARD TO BE INFLUENCED BY LEVEL OF INPUT SIGNAL

BACKGROUND OF THE INVENTION

1. Field of the Invention

The present invention relates to an AGC circuit mounted in a television tuner, and more particularly, to an AGC circuit which is hard to be influenced by the level of an input signal.

2. Description of the Related Art

A conventional automatic gain control (AGC) circuit, for example, includes a voltage dividing circuit which allows a change in an impedance changed by a AGC voltage to be opposite to a change in the input impedance of an amplification transistor, a current negative feedback circuit which allows the change in the impedance changed by the AGC voltage to be equal to the change in the input impedance of the amplification transistor, a variable attenuator composed of a pin attenuator, and an AGC voltage generating circuit, and suppresses a change in the input impedance of an amplifier to prevent reduction of input return loss and deterioration of noise figure (NF) (for example, see Patent Document 1).

[Patent Document 1] Japanese Unexamined Patent Application Publication No. 2001-244766 (FIG. 1)

However, in the conventional circuit, it is difficult to obtain necessary gain reduction (GR) by a frequency.

Accordingly, in the conventional circuit, the variable attenuator composed of the pin attenuator and an operational amplifier are required. Therefore, when the AGC circuit having the above-described configuration is embodied on an integrated circuit, electronic parts other than the amplification transistor and the negative feedback circuit are required and thus the configuration becomes complicated.

In a case where the negative feedback is simply applied to reduce the gain of the amplification circuit and to ensure the GR without using the variable attenuator or the operational amplifier, the NF deteriorates when the level of an input signal is small and the waveform of the signal is distorted when the level of the input signal is large.

SUMMARY OF THE INVENTION

The present invention is to solve the conventional problems and it is an object of the present invention to provide an AGC circuit which can be simply configured in an integrated circuit, prevent noise figure (NF) from deteriorating when the level of an input signal is small, and prevent distortion from being caused when the level of the input signal is large.

According to the present invention, there is provided an AGC circuit including: an amplification element which has an input terminal for receiving an input signal, a ground terminal connected to ground through at least a first resistor, and an output terminal which is connected to a power supply source through at least a second resistor and amplifies and outputs the input signal; an AGC voltage generating part which is provided at the subsequent stage of the amplification element and outputs an AGC voltage according to the strength of the input signal as an analog signal; a signal converting part which digital-converts the AGC voltage into a AGC control signal having a predetermined number of bits; a current negative feedback circuit which changes the impedance of the ground terminal including the first resistor to adjust an gain; and a voltage dividing circuit which changes the impedance of the output terminal including the second resistor to adjust the gain.

According to the present invention, the NF does not deteriorate when the level of the input signal is small and the distortion is hard to be caused when the level of the input signal is large.

It is preferable that, in at least one of the current negative feedback circuit and the voltage dividing circuit, a plurality of resistor attenuator each having a resistor element and a switch element connected in series is provided in parallel to the first resistor or the second resistor as a gain attenuating circuit.

By this configuration, the gain of the AGC circuit can be adjusted by adjusting an impedance based on the AGC control signal stepwise.

For example, it is preferable that the switch element is opened or closed based on the AGC control signal.

By this configuration, the AGC circuit can be set in an optimal state according to the signal level of a received wave.

It is preferable that the AGC control signal output from the signal converting part is proportional or inversely proportional to the AGC voltage.

By this configuration, when the signal level of the received wave is weak, the GR (gain attenuation) is small (the gain is large), and, when the signal level of the received wave is strong, the GR (gain attenuation) becomes a maximum (the gain is a minimum). To this end, it is possible to provide an optimal AGC circuit adjusted according to the level of the received wave.

By this configuration, it is preferable that, when the level of the input signal is less than a predetermined level, the switch element of the voltage dividing circuit is opened or closed in a state that the gain attenuation of the voltage negative feedback circuit is set to a minimum.

By this configuration, since the gain of the voltage dividing circuit is adjusted in a state that the gain attenuation of the current negative feedback circuit is set to a minimum, that is, in a state that the gain of the current negative feedback circuit is set to a maximum, it is possible to prevent the NF from deteriorating.

It is preferable that, when the level of the input signal is greater than a predetermined level, the switch element of the voltage negative feedback circuit is opened or closed in a state that the gain attenuation of the voltage dividing circuit is set to a maximum.

By this configuration, since the gain of the current negative feedback circuit is adjusted in a state that the gain attenuation of the voltage dividing circuit is set to a maximum, that is, in a state that the gain of the voltage dividing circuit is a minimum, the output signal is hard to be distorted.

It is preferable that the switch element is a FET. By this configuration, it is possible to easily integrate the AGC circuit.

According to the AGC circuit of the present invention, it is possible to prevent the NF from deteriorating when the level of the input signal is small and to prevent the distortion from being caused when the level of the input signal is large.

BRIEF DESCRIPTION OF THE DRAWINGS

FIG. 1 is a circuit diagram showing an AGC circuit of an embodiment of the present invention.

DESCRIPTION OF THE PREFERRED EMBODIMENT

FIG. 1 is a circuit diagram showing an AGC circuit according to an embodiment of the present invention. The AGC circuit shown in FIG. 1 is, for example, used for a television tuner and automatically controls the gain of the tuner according to the strength of a received wave.

As shown in FIG. 1, the AGC circuit 10 of the present embodiment includes an amplification element 11 for configuring a main part of the AGC circuit 10, a first gain attenuating circuit (current negative feedback circuit) 12, a second gain attenuating circuit (voltage dividing circuit) 13, a signal converting part 14, and an AGC voltage generating circuit 15.

The amplification element 11 is formed of a MOSFET having a gate terminal (input terminal) 11g, a source terminal (ground terminal) 11s and a drain terminal (output terminal) 11d. Alternatively, the amplification element 11 may be formed of a bipolar transistor having a base terminal, an emitter terminal and a collector terminal.

The gate terminal (input terminal) 11g of the amplification element 11 is, for example, connected to a RF input part of the television tuner through an impedance matching inductor 16 and receives a television signal (RF signal) as an input signal Vin. A current source 17 for flowing constant drain current is formed between the source terminal (ground terminal) 11s of the amplification element 11 and ground GND. A DC cut capacitor C and a first resistor RA connected in series are formed across the current source 17. The first resistor RA is connected in parallel to the first gain attenuating circuit 12 which functions as a current negative feedback circuit.

Meanwhile, the drain terminal (output terminal) 11d of the amplification element 11 is connected to a second resistor RB and a load inductor L1 connected in series. The drain terminal (output terminal) 11d is connected to a power supply source Vcc through the second resistor RB and the load inductor L1, and the second resistor RB is connected in parallel to the second gain attenuating circuit 13 which functions as a voltage dividing circuit.

The first gain attenuating circuit 12 includes a plurality of resistor attenuators each having a resistor element and a switch element connected in series. That is, the first gain attenuating circuit 12 includes a resistor attenuator including a resistor element RA0 and a switch element SA0 connected in series, a resistor attenuator including a resistor element RA1 and a switch element SA1 connected in series, and a resistor attenuator including a resistor element RA2 and a switch element SA2 connected in series. The resistor attenuators are connected across the first resistor RA in parallel.

Each switching element SA (SA0, SA1 or SA2), for example, includes a MOSFET, one ends of the resistor elements RA0, RA1 and RA2 are connected to a connection point P between one end of the first resistor RA and the capacitor, the other ends of the resistors RA0, RA1 and RA2 are connected to one ends (drain terminals) of the switch elements SA0, SA1 and SA2, respectively, and the other ends (source terminals) of the switch elements SA0, SA1 and SA2 are connected to the other end (ground) of the first resistor RA.

When a predetermined voltage is applied to the input terminal (gate terminal) of each switch element SA to close the one end and the other end of each switch element (ON state), it is possible to connect the resistor elements RA0, RA1 and RA2 to the first resistor RA in parallel.

The resistance values of the first resistor RA and the resistor elements satisfy a relationship of RA=RA0=2·RA1=4·RA2. To this end, for example, when a predetermined voltage is applied to the input terminal of the switch element SA0 to connect the resistor element RA0 to the first resistor RA in parallel, the impedance ZA of the first gain attenuating circuit 12 is set to a half of the first resistor RA (RA/2). Subsequently, when the resistor element RA1 is connected to the first resistor RA in parallel, the impedance ZA of the first gain attenuating circuit 12 is set to ¼ of the first resistor RA (RA/4), and, when the resistor element RA2 is connected to the first resistor RA in parallel, the impedance ZA is set to ⅛ of the first resistor RA (RA/8). That is, the impedance ZA can vary stepwise.

Meanwhile, the second gain attenuating circuit 13 also includes a plurality of resistor attenuators each having a resistor element and a switch element connected in series. That is, the second gain attenuating circuit 13 includes a resistor attenuator including a resistor element RB0 and a switch element SB0 connected in series, a resistor attenuator including a resistor element RB1 and a switch element SB1 connected in series, and a resistor attenuator including a resistor element RB2 and a switch element SB2 connected in series. The resistor attenuators are connected across the second resistor RB in parallel. Similar to the above, each switching element SB (SB0, SB1 or SB2) includes a MOSFET, one ends of the resistor elements RA0, RA1 and RA2 are connected to one end of the second resistor RB, the other ends of the resistors RB0, RB1 and RB2 are connected to one ends (drain terminals) of the switch elements SB0, SB1 and SB2, respectively, and the other ends (source terminals) of the switch elements SB0, SB1 and SB2 are connected to the other end of the second resistor RB.

When a predetermined voltage is applied to the input terminal (gate terminal) of each switch element SB to close the one end and the other end of each switch element (ON state), it is possible to connect the resistor elements RA0, RA1 and RA2 to the second resistor RB in parallel.

The resistance values of the second resistor RB and the resistor elements satisfy a relationship of RB=RB0=2·RB1=4·RB2. To this end, when a predetermined voltage is applied to the input terminal of the switch element SB0 to connect the resistor element RB0 to the second resistor RB in parallel, the impedance (impedance between the connection point P and the ground) ZB of the second gain attenuating circuit 13 is set to a half of the second resistor RB (RB/2). Subsequently, when the switch element RB1 is closed and the resistor element RB1 is connected to the second resistor RB in parallel, the impedance ZB of the second gain attenuating circuit 13 is set to ¼ of the second resistor RB (RB/4), and, when the switch element SB2 is closed and the resistor element RB2 is connected to the second resistor RB in parallel, the impedance ZB is set to ⅛ of the second resistor RB (RB/8). That is, the impedance ZA can vary stepwise.

One end of the impedance ZB of the second gain attenuating circuit 13 outputs an output signal Vout.

The signal converting part 14, for example, includes an 6-bit A/D converter and serves to convert an AGC voltage (analog value) input by the input terminal into a predetermined digitalized AGC control signal to perform encoding.

The AGC voltage generating circuit 15 outputs the AGC voltage which is proportional (or inversely proportional) to the strength of a received wave from a detected image signal as a DC voltage (analog), and, for example, automatically controls the gain of a television tuner or an image intermediate-frequency amplification circuit. When the input wave is strong, the AGC voltage having a low voltage level is output, and, when the input wave is weak, the AGC voltage having a high voltage level is output. In the following description, a case where the AGC voltage inversely proportional to the strength of the received wave is output will be described. When the AGC voltage proportional to the strength of the received wave is output, the signal converting part 14 outputs the AGC control voltage inversely proportional to the AGC voltage.

In the AGC control signal, upper three bits (A2, A1, A0) are assigned to the switch elements SA0, SA1 and SA2 of the first gain attenuating circuit 12 and lower three bits (B2, B1, B0) are assigned to the switch elements SB0, SB1 and SB2 of the second gain attenuating circuit 13. That is, the first gain attenuating circuit 12 and the second gain attenuating circuit 13 operate based on the AGC control signal, that is, the AGC voltage output from the AGC voltage generating circuit.

Table 1 shows a relationship between the AGC voltage (analog) and the AGC control signal (digital) for driving the AGC circuit.

TABLE 1

| AGC voltage | AGC control voltage | | | | | | Main switch state |
|---|---|---|---|---|---|---|---|
| | A2 | A1 | A0 | B2 | B1 | B0 | |
| 2.5 V (full gain) | 1 | 1 | 1 | 1 | 1 | 1 | ALL SA, SB ON |
| | 1 | 1 | 0 | 1 | 1 | 1 | SA0 OFF |
| | 1 | 0 | 1 | 1 | 1 | 1 | SA1 OFF |
| | 1 | 0 | 0 | 1 | 1 | 1 | SA0, 1 OFF |
| | 0 | 1 | 1 | 1 | 1 | 1 | SA2 OFF |
| | 0 | 1 | 0 | 1 | 1 | 1 | SA0, 2 OFF |
| | 0 | 0 | 1 | 1 | 1 | 1 | SA1, 2 OFF |
| | 0 | 0 | 0 | 1 | 1 | 1 | ALL SB ON |
| | 0 | 0 | 0 | 1 | 1 | 0 | SB1, 2 ON |
| | 0 | 0 | 0 | 1 | 0 | 1 | SB0, 2 ON |
| | 0 | 0 | 0 | 1 | 0 | 0 | SB2 ON |
| | 0 | 0 | 0 | 0 | 1 | 1 | SB0, 1 ON |
| | 0 | 0 | 0 | 0 | 1 | 0 | SB1 ON |
| | 0 | 0 | 0 | 0 | 0 | 1 | SB0 ON |
| 0.5 V (maximum GR) | 0 | 0 | 0 | 0 | 0 | 0 | ALL SA, SB OFF |

1 = ON, 0 = OFF

As shown in Table 1, for example, the signal converting part 14 outputs (A2, A1, A0, B2, B1, B0)=(0, 0, 0, 0, 0, 0) as the AGC control signal when the AGC voltage is 0.5 V, and outputs (A2, A1, A0, B2, B1, B0)=(1, 1, 1, 1, 1, 1) as the AGC control signal when the AGC voltage is 2.5 V (full gain). The signal converting part 14 outputs the AGC control signal according to the AGC voltage when the AGC voltage is greater than 0.5 V and less than 2.5 V.

Now, the operation of the AGC circuit will be described.

In the AGC circuit 10, the first gain attenuating circuit 12 which functions as the current negative feedback circuit is provided at an input side and the second gain attenuating circuit 13 which functions as the voltage dividing circuit is provided at an output side.

Since the second gain attenuating circuit 13 is provided at the output side next to the amplification element 11, noise figure (NF) is hard to be influenced although the attenuation thereof increases. The first gain attenuating circuit 12 which is provided at the input side can improve the distortion of the amplification element 11 as the current negative feedback circuit.

(When the input wave is strong (When the level of the AGC voltage is low))

When the input wave is strong and the level of the RF signal (input signal Vin) is larger than a predetermined level, the AGC voltage generating circuit outputs the AGC voltage having the low voltage level. To this end, when the input wave is strong, the lower bits (B2, B1, B0) are changed prior to the upper bits (A2, A2, A0).

When the input wave is strong (when the AGC voltage is low), the switch elements SB0, SB1 and SB2 of the second gain attenuating circuit 13 are driven according to the lower bits (B2, B1, B0) of the AGC control signal which are centrally changed.

Since the AGC circuit 10 is basically a source-ground type negative feedback amplification circuit, the gain of the AGC circuit is substantially proportional to the impedance ZB of the second gain attenuating circuit (voltage dividing circuit) 13 provided at the output side and the direction thereof is negative. Accordingly, when the GR (gain attenuation) of the AGC circuit 10 is stepwise changed depending on the impedance ZB changed by the AGC control voltage, that is, changed in a direction in which the AGC control voltage decreases (direction in which the received wave becomes stronger), the AGC circuit 10 can operate in a direction in which the GR increases. Accordingly, although the received wave is strong and the input signal Vin is large, it is possible to prevent an output signal from being distorted. When the GR of the AGC circuit 10 is changed in direction in which the AGC control voltage increases (direction in which the received wave becomes weaker, the AGC circuit can operate in direction in which the GR decreases.

At this time, the upper bits (A2, A2, A0) are substantially fixed to (0, 0, 0) and all the switch elements SA0, SA1 and SA2 of the first gain attenuating circuit 12 are opened (OFF state). Therefore, the impedance ZA of the first gain attenuating circuit 12 provided at the input side is fixed in a highest state (only the first resistor RA) and thus the GR (gain attenuation) is not changed in the first gain attenuating circuit 12. Accordingly, it is possible to suppress the first gain attenuating circuit 12 from influencing the distortion.

(When the input wave is weak (when the level of the AGC voltage is high))

When the input wave is weak and the level of the RF signal (input signal Vin) is less than a predetermined level, the AGC voltage generating circuit outputs the AGC voltage having a high voltage level. To this end, as shown in Table 1, the lower bits (B2, B1, B0) are fixed to (1, 1, 1) and the upper bits (A2, A1, A0) are centrally changed.

Accordingly, when the input wave is weak (the AGC voltage is high), all the switch elements SB0, SB1 and SB2 of the second gain attenuating circuit 13 are closed (ON state) and the impedance ZB of the second gain attenuating circuit 13 is fixed to RB/8. That is, the GR (gain attenuation) of the AGC circuit 10 can be set in a minimum state (gain of the amplification element is in a maximum state).

In this state, in the AGC circuit 10, the switch elements SA0, SA1 and SA2 of the first gain attenuating circuit (current negative feedback circuit) 12 centrally operate and thus the impedance ZA is changed.

In general, when the current negative feedback is applied to the amplification circuit, the gain is attenuated and thus the NF tends to deteriorate. However, in the present invention, since the gain attenuating function is performed by the first gain attenuating circuit (current negative feedback circuit) 12 and the second gain attenuating circuit (voltage dividing circuit) 13, although the gain is attenuated due to the current negative feedback, the second gain attenuating circuit (voltage dividing circuit) 13 provided at the output side of the amplification element 11 operates in a maximum gain state and thus the attenuation of the gain of the first gain attenuating circuit (current negative feedback circuit) 12 can be compensated. Accordingly, it is possible to suppress the NF from being influenced. That is, even when the level of the input signal Vin is small, the NF does not deteriorate.

Although, in the AGC circuit 10 of the present embodiment, the first gain attenuating circuit 12 is provided at the input side (between the ground terminal of the amplification element 11 and ground) as the current negative feedback circuit, the second gain attenuating circuit 13 is provided at the output side (between the power supply source Vcc and the ground terminal of the amplification element 11) as the voltage negative feedback circuit, and the first and second gain attenuating circuits 12 and 13 are driven together by the AGC control voltage, the present invention is not limited thereto. That is, only the first gain attenuating circuit (current negative feedback circuit) 12 may be provided at the input side or only the second gain attenuating circuit (voltage dividing circuit) 13 may be provided at the output side.

At least one of the first gain attenuating circuit (current negative feedback circuit) 12 and the second gain attenuating circuit (voltage dividing circuit) 13 includes a plurality of resistor attenuators each having a resistor element and a switch element connected in series.

Although the first and second gain attenuating circuits 12 and 13 of the present embodiment include three resistor attenuators and are driven by 6-bit AGC control signal, the present invention is not limited thereto. That is, the number of the resistor attenuators may be two or at least four. As the number of the resistor attenuators increases, the GR (gain attenuation) can be finely adjusted. In this case, the AGC control signal has the same number of bits as the number of the resistor attenuators (number of the switch elements).

Although each of the switch elements SA (SA0, SA1 and SA2) and SB (SB0, SB1 and SB2) is formed of the MOSFET, the switch element may be formed of a bipolar transistor or a contact element such as a relay. The MOSFET is advantageous in integration or cost.

What is claimed is:

1. An AGC circuit comprising:
   an amplification element which has an input terminal for receiving an input signal, a ground terminal connected to ground through at least a first resistor, and an output terminal which is connected to a power supply source through at least a second resistor and amplifies and outputs the input signal;
   an AGC voltage generating part which is provided at a subsequent stage of the amplification element and outputs an AGC voltage according to the strength of the input signal as an analog signal;
   a signal converting part which digital-converts the AGC voltage into a AGC control signal having a predetermined number of bits;
   a current negative feedback circuit which changes an impedance of the ground terminal including the first resistor to adjust an gain; and
   a voltage dividing circuit which changes an impedance of the output terminal including the second resistor to adjust the gain.

2. The AGC circuit according to claim 1, wherein, in at least one of the current negative feedback circuit and the voltage dividing circuit, a plurality of resistor attenuator each having a resistor element and a switch element connected in series is provided in parallel to the first resistor or the second resistor as a gain attenuating circuit.

3. The AGC circuit according to claim 2, wherein the switch element is opened or closed based on the AGC control signal.

4. The AGC circuit according to claim 1, wherein the AGC control signal output from the signal converting part is proportional or inversely proportional to the AGC voltage.

5. The AGC circuit according to claim 2, wherein, when the level of the input signal is less than a predetermined level, the switch element of the voltage dividing circuit is opened or closed in a state that the gain attenuation of the voltage negative feedback circuit is set to a minimum.

6. The AGC circuit according to claim 2, wherein, when the level of the input signal is greater than a predetermined level, the switch element of the voltage negative feedback circuit is opened or closed in a state that the gain attenuation of the voltage dividing circuit is set to a maximum.

7. The AGC circuit according to claim 2, wherein the switch element is a FET.

* * * * *